(12) United States Patent
Chao et al.

(10) Patent No.: US 7,258,966 B2
(45) Date of Patent: *Aug. 21, 2007

(54) METHOD FOR MANUFACTURING A DIFFUSER FOR A BACKLIGHT MODULE

(75) Inventors: Ching-Yu Chao, Taipei (TW); Wen-Jiunn Hsieh, Jhonghe (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 416 days.

This patent is subject to a terminal disclaimer.

(21) Appl. No.: 10/754,725

(22) Filed: Jan. 12, 2004

(65) Prior Publication Data

US 2004/0253546 A1  Dec. 16, 2004

(30) Foreign Application Priority Data

Jun. 10, 2003   (TW)   .............................. 92115666 A

(51) Int. Cl.
*G03C 5/00*   (2006.01)

(52) U.S. Cl. ...................................... 430/320; 430/395

(58) Field of Classification Search ................ 430/396, 430/5

See application file for complete search history.

(56) References Cited

U.S. PATENT DOCUMENTS

| | | | | |
|---|---|---|---|---|
| 4,664,748 A * | 5/1987 | Ueno et al. | .................... | 216/51 |
| 6,428,943 B1 * | 8/2002 | Wells et al. | ................. | 430/313 |
| 6,962,844 B2 * | 11/2005 | Stasiak | ....................... | 438/237 |
| 7,005,079 B2 * | 2/2006 | Chao et al. | .................... | 216/42 |

* cited by examiner

*Primary Examiner*—Kathleen Duda
(74) *Attorney, Agent, or Firm*—Bacon & Thomas, PLLC

(57) ABSTRACT

A method for manufacturing a diffuser for a backlight module is disclosed. The method includes providing a transparent substrate; forming a first transparent photoresist layer on the transparent substrate; spreading a plurality of masking particles on the first transparent photoresist layer; exposing and developing the first transparent photoresist layer; removing the masking particles; etching the exposed region of the first transparent photoresist layer to form a first scattering array; and optionally forming a passivation layer on the first transparent photoresist layer.

12 Claims, 3 Drawing Sheets

METHOD FOR MANUFACTURING A DIFFUSER FOR A BACKLIGHT MODULE

BACKGROUND OF THE INVENTION

1. Field of the Invention

The present invention relates to a method for manufacturing a diffuser for a backlight module and, more particularly, to a method for manufacturing a diffuser using particles as a mask.

2. Description of Related Art

Currently, flat panel displays, such as LCDs and PDPs are gradually replacing the traditional CRT displays and becoming the main stream of displays due to their light weight and thin size.

Contemporary flat panel displays use backlight modules as their sources of light. Generally, a backlight module includes a light source, a light guide, and two diffusers. The diffusers are used to make a uniform dispersion of light and prevent the displaying zone of a display from suffering non-uniform illumination.

The common methods for manufacturing a diffuser include the particle adhesion method and the sandblast method. In the particle adhesion method, the scattering particles are adhered on the surface of a transparent substrate by using an adhesive, as shown in FIG. 1, so that the light is scattered by the particles and becomes uniform. The sandblast method firstly forms a non-uniform surface on the transparent substrate by sand grinding. The light from the light source is scattered by the non-uniform surface to harmonize the light. The disadvantages of the particle adhesion method lie in that the scattering particles cannot be dispersed uniformly in the adhesive due to the gravity or static electricity factors, and the sieving of particle size of the scattering particles is complex and needs to be done carefully because it will affect the performance of light diffusion. Besides, those scattering particles are mostly made of hard inorganic materials, such as silica or calcium carbonate, which will damage the surface of a liquid crystal (LC) cell through direct contact and therefore a passivation layer is further needed.

The Japanese patent JP5173130 disclosed a light guide having functions of diffusion, reflection, and total reflection, wherein the function of diffusion is achieved through roughening the surface of the light guide by using the sandblast method. However, the sandblast method cannot precisely control the roughness of the surface and the uniformity thereof so that the quality of light guide is not easily controlled in mass production.

Therefore, it is desirable to provide a method for manufacturing a diffuser for a backlight module to mitigate and/or obviate the aforementioned problems.

SUMMARY OF THE INVENTION

The object of the present invention is to provide a method for manufacturing a diffuser for a backlight module, wherein the masking particles are utilized for carrying out the photolithography processes, which simplifies the manufacturing of a diffuser, avoids the complex step of dispersing particles, and provides a diffuser having an excellent diffusing efficiency.

To achieve the object, the method for manufacturing a diffuser for a backlight module of the present invention includes providing a transparent substrate; forming a first transparent photoresist layer on said transparent substrate; spreading a plurality of masking particles on said first transparent photoresist layer; exposing and developing said first transparent photoresist layer; removing said masking particles; etching the exposed region of said first transparent photoresist layer to form a first scattering array; and optionally forming a passivation layer on said first transparent photoresist layer.

In brief, the present invention uses particles as a mask to form a suitably patterned and sized photoresist, which aids the following etching step to form a desired diffuser. According to the experiment results, the diffuser having preferred diffusing efficiency is obtained as the particle size of the masking particles is close to the wavelength of the light source. The method disclosed herein not only controls the precision of the diffusing efficiency well, but also can flexibly choose the particle size of the masking particles according to the wavelength of the light source, and therefore achieves a high yield of diffusers, which achieves the best performance of light diffusion.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
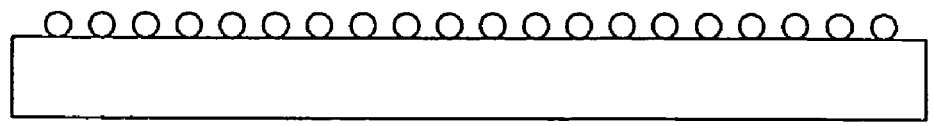
FIG. 1 is a perspective view of a diffuser in the prior art.
Figure 2A:
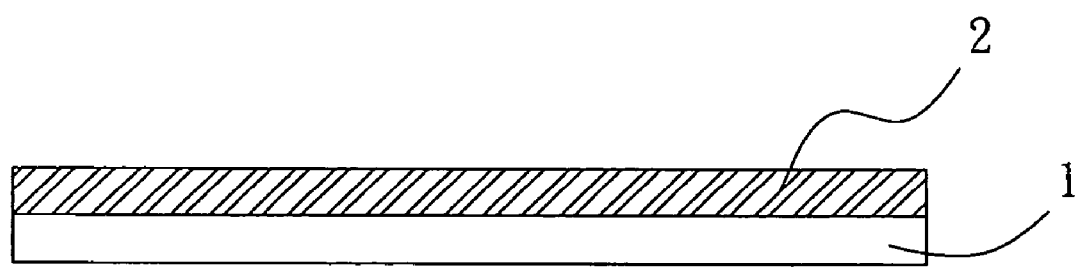
FIGS. 2a to 2g are perspective views of each step of a preferred embodiment of the present invention.
Figure 2B:
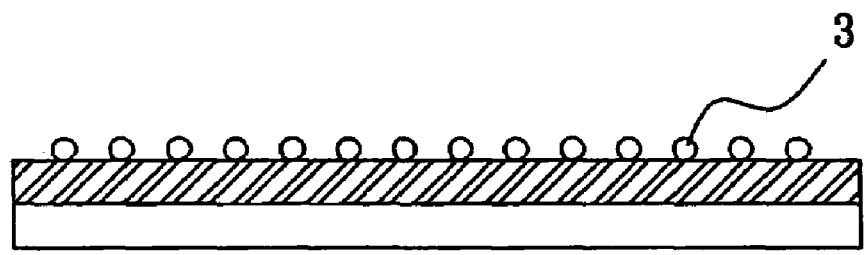

The material of the transparent substrate is not restricted in the method for manufacturing a diffuser for a backlight module of the present invention. Preferably, the transparent substrate is made of acrylates, polyethylene terephthalate (PET), or polycarbonate (PC). The kind of the photoresist is not restricted. Preferably, the photoresist has at least one photo-sensitive polymer and one photo initiator. More preferably, the photoresist is a polyacrylate-based photoresist. The material of the masking particles in the present invention is not restricted, and preferably is selected from the group consisting of glass, $TiO_2$, silica, and polystyrene. The particle sizes of the masking particles are not restricted, and may be adjusted according to the light source. Preferably, the particle sizes range from 100 nm to 50 μm. The material of the passivation layer in the method of the present invention is not restricted. Preferably, the passivation layer is made of polyacrylates, polycarbonate, polyethylene terephthalate (PET), or polyethylene (PE). The quantity of layers of the scattering array in the method for manufacturing a diffuser for a backlight module of the present invention is not restricted and may optionally be two layers, three layers, etc. by repeating the manufacturing steps of the scattering array. Preferably, there are three layers of scattering array. With reference to FIGS. 2a to 2g, there are shown perspective views of each step of a preferred embodiment of the present invention. As shown in FIG. 2a, a transparent substrate 1 is provided firstly, and then a first photoresist layer 2 is formed thereon. The photoresist layer can be made of any well-known photoresist, such as polyacrylates, polystyrene, or polyethylene. In the present embodiment, the first photoresist layer is made of polymethylmethacrylate (PMMA). The application manner of the photoresist is not restricted.

After the formation of the photoresist, a plurality of masking particles 3 is spread on the photoresist layer 2 for functioning as a mask in a subsequent photolithography process. The material of the masking particles is not restricted and can be any kind of opaque materials, such as glass, $TiO_2$, silica, or polystyrene. In the present embodiment, the masking particles are made of polystyrene. The particle size can be chosen flexibly according to the wavelength of the light source of the backlight module in order to obtain the best diffusion efficiency. The particle size of the masking particles used in the present invention ranges from 2 to 100 µm. The spreading method of the masking particles 3 is not restricted and may be a random or uniform spreading. Furthermore, the density of the masking particles on the first photoresist layer 2 may be adjusted according to the requirement of process.

Figure 2C:
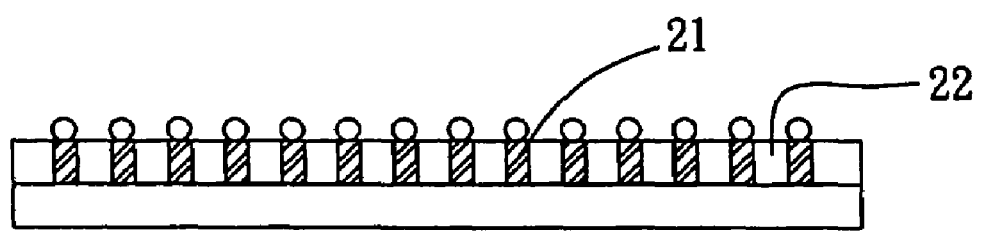

After the lithography process has been carried out, the region 21 covered by the masking particles 3 is not photo-polymerized, and the region 22 which was not covered by the masking particles 3 is photo-polymerized, as shown in FIG. 2c. The aforementioned difference facilitates the following etching process.

Figure 2D:

As shown in FIG. 2d, the masking particles are removed by washing with pure water and ultra-sonic vibration, and then the region 22 of the photoresist layer is etched by using 2.38% TMAH aq. or 0.67% KOH aq. for 60 secs. As a result, the region 21 of the photoresist layer is left and forms the first scattering array.

Figure 2E:
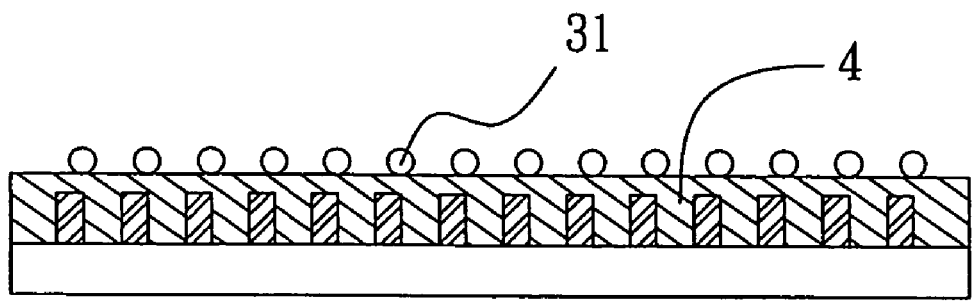

Afterwards, a second photoresist layer 4 is formed on the first scattering array and then a plurality of masking particles 31 is spread on the second photoresist layer 4, as shown in FIG. 2e. The material of the second photoresist layer is not restricted and can be any commonly used photoresist that has a refractive index equaling or differing from that of the first photoresist layer. In the present embodiment, the second photoresist layer is made of polymethylmethacrylate (PMMA). Both the material and particle size of the masking particles 31 are the same as the masking particles 3 spread on the first photoresist layer 2. However, the material and particle size of the masking particles 31 mainly depend on the requirements of the process and masking particles 31 having different material and particle size from masking particles 3 are also practical. Similarly, the spreading method of the masking particles 31 is not restricted, and may be adjusted according to the requirements of the process. The spreading method in the preferred embodiment is uniform density spreading.

Figure 2F:
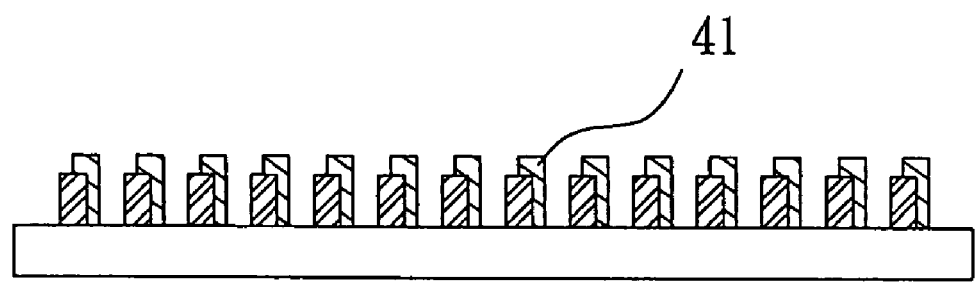

As shown in FIG. 2f, after the lithography process has been carried out, the masking particles 31 have been removed, and the developed region of the second photoresist layer has been etched, the undeveloped region 41 of the second photoresist layer is left and forms a second scattering array.

Figure 2G:
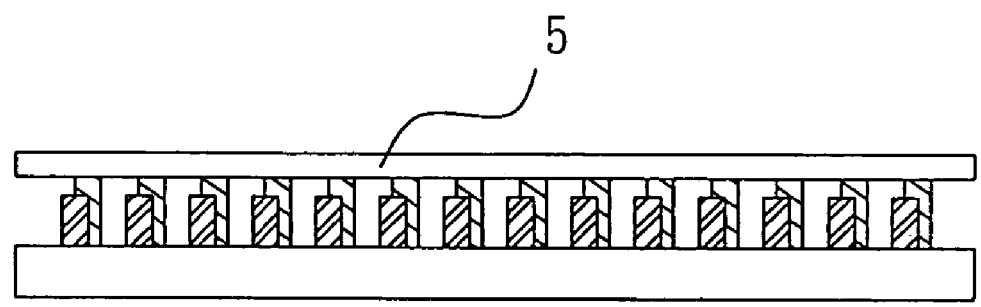

Finally, a passivation layer 5 is formed on the second scattering array, as shown in FIG. 2g. On the one hand the passivation layer 5 shields the scattering arrays, and on the other it guards the displaying panel of a display. The material of the passivation layer 5 is not restricted and may be PET or PE of the prior arts. In the present embodiment the passivation layer 5 is made of PE.

The embodiment aforesaid forms a first scattering array firstly, and then forms a second scattering array. Actually, it is optional to form the second scattering array or not, or even a third scattering array, a fourth scattering array, . . . etc. may be further added if needed. All of the scattering arrays can be formed by any one processe illustrated above.

Concluding from the aforementioned, the method for manufacturing a diffuser for a backlight module of the present invention applies the photolithography process using particles as a mask. The particle sizes of the masking particles are chosen to form a scattering array that fits the various wavelengths of light sources, which consequently achieves the best performance of light diffusion. Moreover, the spreading method of the masking particles is flexible. With careful selection of the spreading method, the diffusers manufactured by the present invention have a high diffusion performance and are suitable for various displays.

Although the present invention has been explained in relation to its preferred embodiment, it is to be understood that many other possible modifications and variations can be made without departing from the spirit and scope of the invention as hereinafter claimed.

What is claimed is:

1. A method for manufacturing a diffuser for a backlight module comprising:
   (a) providing a transparent substrate;
   (b) forming a first transparent photoresist layer on said transparent substrate;
   (c) spreading a plurality of masking particles on said first transparent photoresist layer;
   (d) exposing said first transparent photoresist layer;
   (e) removing said masking particles; and
   (f) etching to develop said first transparent photoresist layer to form a first scattering array.

2. The method as claimed in claim 1 further comprising a step (g) forming a passivation layer on said first transparent photoresist layer.

3. The method as claimed in claim 2, wherein said passivation layer is made of polyacrylates, polycarbonate, polyethylene terephthalate (PET), or polyethylene (PE).

4. The method as claimed in claim 1, wherein said first transparent photoresist layer having at least a photo-sensitive polymer and a photo initiator.

5. The method as claimed in claim 1, wherein said transparent substrate is made of acrylic, polyethylene terephthalate (PET), or polycarbonate (PC).

6. The method as claimed in claim 1, wherein said first transparent photoresist layer is a polyacrylate-based photoresist.

7. The method as claimed in claim 1, wherein said masking particles are made of glass, TiO2, silica, or polystyrene.

8. The method as claimed in claim 1, wherein the particle size of said masking particles ranges from 100 nm to 50 µm.

9. The method as claimed in claim 1 further comprising the following steps after step (f):
   (f-1) depositing a second transparent photoresist layer on said transparent substrate and said first scattering array;
   (f-2) spreading a plurality of masking particles on said second transparent photoresist layer;
   (f-3) exposing said second transparent photoresist layer;
   (f-4) removing said masking particles; and
   (f-5) etching to develop said second transparent photoresist layer to form a second scattering array.

10. The method as claimed in claim 9 further comprising a step (g2) forming a passivation layer on said second transparent photoresist layer.

11. The method as claimed in claim 9, wherein said second transparent photoresist layer having at least a photo-sensitive polymer and a photo initiator.

12. The method as claimed in claim 9, wherein said second transparent photoresist layer is a polyacrylate-based photoresist.

* * * * *